(12) United States Patent
Van Bommel et al.

(10) Patent No.: US 12,082,318 B2
(45) Date of Patent: Sep. 3, 2024

(54) COLOR TEMPERATURE CONTROLLABLE LED FILAMENT LAMP PROVIDING IMPROVED LIGHT QUALITY

(71) Applicant: SIGNIFY HOLDING B.V., Eindhoven (NL)

(72) Inventors: Ties Van Bommel, Horst (NL); Rifat Ata Mustafa Hikmet, Eindhoven (NL); Johannes Petrus Maria Ansems, Hulsel (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 18 days.

(21) Appl. No.: 17/918,921

(22) PCT Filed: Apr. 12, 2021

(86) PCT No.: PCT/EP2021/059430
§ 371 (c)(1),
(2) Date: Oct. 14, 2022

(87) PCT Pub. No.: WO2021/209382
PCT Pub. Date: Oct. 21, 2021

(65) Prior Publication Data
US 2023/0300958 A1 Sep. 21, 2023

(30) Foreign Application Priority Data

Apr. 16, 2020 (EP) ..................... 20169879

(51) Int. Cl.
*H05B 45/20* (2020.01)
*H05B 45/325* (2020.01)
(Continued)

(52) U.S. Cl.
CPC ......... *H05B 45/20* (2020.01); *H05B 45/3577* (2020.01)

(58) Field of Classification Search
None
See application file for complete search history.

(56) References Cited

U.S. PATENT DOCUMENTS

| 2013/0020956 A1 | 1/2013 | Zhang et al. |
| 2013/0093362 A1 | 4/2013 | Edwards |
| (Continued) | | |

FOREIGN PATENT DOCUMENTS

| CN | 209638798 U | 11/2019 |
| EP | 1502483 B1 | 12/2008 |
| (Continued) | | |

*Primary Examiner* — Wei (Victor) Y Chan (57) ABSTRACT

A lighting device (320) comprising at least one first light-emitting diode, LED, filament (100) adapted to emit light with a first correlated color temperature, CCT, and at least one second LED filament (200) adapted to emit light with a second, different, CCT. Each of the LED filaments is arranged to emit a first, larger, portion of light (112) from a first side (105), and a second, smaller, portion of light (114) from a second side (107). A longitudinal axis (A) extends from a base (322) of the lighting device to a top portion (330) of the envelope. Each of the at least one first LED filament is arranged at a first angle ( ) from the longitudinal axis, with its first surface generally facing towards the top portion of the lighting device, and each of the at least one second LED filament is arranged at a second angle ( ) from the longitudinal axis, with its first surface generally facing towards the base.

15 Claims, 5 Drawing Sheets

(51) Int. Cl.
 *H05B 45/3577* (2020.01)
 *H05B 47/11* (2020.01)
 *H05B 47/155* (2020.01)
 *H05B 47/19* (2020.01)

(56) References Cited

U.S. PATENT DOCUMENTS

2018/0245744 A1   8/2018  Li
2019/0191516 A1*  6/2019  Li .......................... H05B 33/14
2020/0154545 A1*  5/2020  An ......................... H01L 25/167

FOREIGN PATENT DOCUMENTS

| WO | 2018127391 A1 | 7/2018 |
| WO | 2019166273 A1 | 9/2019 |
| WO | 2020016058 A1 | 1/2020 |

* cited by examiner

COLOR TEMPERATURE CONTROLLABLE LED FILAMENT LAMP PROVIDING IMPROVED LIGHT QUALITY

CROSS-REFERENCE TO PRIOR APPLICATIONS

This application is the U.S. National Phase application under 35 U.S.C. § 371 of International Application No. PCT/EP2021/059430, filed on Apr. 12, 2021, which claims the benefit of European Patent Application No. 20169879.2, filed on Apr. 16, 2020. These applications are hereby incorporated by reference herein.

TECHNICAL FIELD

The present disclosure relates generally to the field of solid-state lighting. More specifically, it relates to a lighting device comprising light-emitting diode filaments providing different color temperatures.

BACKGROUND

Incandescent lamps are rapidly being replaced by light-emitting diode (LED) based lighting solutions. It is nevertheless appreciated and desired by users to have retrofit lamps which have the look of an incandescent bulb.

Solid-state lighting devices may provide many advantages over their incandescent, fluorescent, and gas-discharge based counterparts. For instance, they may provide increased operational life, reduced power consumption and higher efficacy. Solid-state lighting devices, such as LEDs, are employed in a wide range of lighting applications.

Development of LED-based lighting devices is ever ongoing and may provide new solutions extending far beyond what has been possible using conventional light sources.

WO 2019/166273 discloses a LED filament lamp, comprising a light emitting diode light source with at least one first filament, arranged to emit light having a first color temperature, and at least one second filament, arranged to emit light having a second color temperature, different from the first color temperature, wherein each of the first and second filaments comprises a substrate of elongated shape, wherein at least one light emitting diode is arranged on the substrate. The LED filament lamp further comprises a control unit configured to control a first intensity of the light emitted from the first filament(s) and to control a second intensity of the light emitted from the second filament(s) according to at least one predetermined setting, in order to control the total color temperature of the light emitted from the LED filament lamp as a function of the predetermined setting(s).

SUMMARY

One general aim of the present disclosure is to provide a lighting device providing light with different color temperatures in different directions. Further, the present lighting device may provide light in different directions.

This and other objectives are achieved by means of a lighting device as defined in the appended independent claim. Other embodiments are defined by the dependent claims.

According to a first aspect of the present disclosure, a lighting device is provided. The lighting device comprises at least one first light-emitting diode (LED) filament, which is adapted to emit light with a first correlated color temperature (CCT). The lighting device further comprises at least one second LED filament, which is adapted to emit light with a second CCT, different from the first CCT. Each LED filament, i.e. each of the first LED filament(s) and each of the second LED filament(s), has a first side and a second side being arranged opposite to each other and extending along a direction of elongation of the LED filament. Further, each LED filament, i.e. each of the first LED filaments and each of the second LED filaments, is arranged to emit (or output) a first, larger, portion of light from its first side and a second, smaller, portion of light from its second side.

The lighting device further comprises a base connectable with a luminaire socket, and an at least partially light-transmissive envelope. The envelope at least partially envelops the at least one first LED filament and the at least one second LED filament. The envelope is mounted on the base.

A longitudinal axis extends from the base to a top portion of the envelope (the top portion being opposite to the base along the longitudinal axis).

Each of the at least one first LED filament is arranged at a first angle with respect to the longitudinal axis. Each of the at least one first LED filament is further arranged (rotated/angled) such that its first side generally faces towards the top portion of the lighting device. The second side of each of the at least one first LED filament thus generally faces the base of the lighting device. The first angle may be defined as the angle formed from the first LED filament to the longitudinal axis.

Each of the at least one second LED filament is arranged at a second angle with respect to the longitudinal axis. Each of the at least one second LED filament is further arranged (rotated/angled) such that its first side generally faces towards the base of the lighting device. The second side of each of the at least one second LED filament thus generally faces towards the top portion of the lighting device. The second angle may be defined as the angle formed from the second LED filament to the longitudinal axis.

Whiteness of light sources is often described in relation to ideal black body radiators. When the temperature of an ideal black body increases, the body starts glowing (emitting light). For relatively low temperatures, red light is emitted. As the temperature increases further, the emitted light turns yellow, and finally, for very high temperatures, the emitted light becomes white. The correlated color temperature (CCT) of a light source is the temperature (expressed in kelvin) of an ideal black body radiator showing the most similar color. The black body line, or black body locus (BBL) is the path that such a black body would take in a particular chromaticity space as its temperature changes. In other words, the BBL includes or describes the different colors an ideal black body would emit for different temperatures.

In a sense, the everyday notion of color temperature is opposite to the CCT scale. Usually, a redder light is described to be warm, while a white-blue light is described as cold. In the CCT scale, a red (warm) light corresponds to a lower (colder) temperature, while a white-blue (cold) light corresponds to a higher (warmer) temperature.

Each of the at least one first LED filament may emit (or output) a larger portion of its light from its first side. As each of the at least one first LED filament is arranged at an angle from the longitudinal axis such that the first side of the LED filament generally faces towards the top of the lighting device, a larger amount (or portion) of light having the first CCT may be emitted (or output) from the top of the lighting device rather than from the bottom of the lighting device.

Similarly, each of the at least one second LED filament may emit (or output) a larger portion of its light from its first side. As each of the at least one second LED filament is arranged at an angle from the longitudinal axis such that the first side of the LED filament generally faces towards the base of the lighting device, a larger amount (or portion) of light having the second CCT may be emitted (or output) from the base of the lighting device rather than from the top of the lighting device. Thus, lighting devices as described in this disclosure may provide light with one color temperature (with a larger portion of light having the first CCT and a smaller portion of light having the second CCT) from the top of the lighting device, and light with another color temperature (with a smaller portion of light having the first CCT and a larger portion of light having the second CCT) near the base of the lighting device.

Thus, a single lighting device may provide light having different color temperatures in different directions, thereby providing a single lighting device for different purposes of illumination. It is also possible to use said lighting device for providing light in different directions. For example, light with a first color temperature may exit from the top of the lighting device (or the luminaire in which the lighting device is arranged), thereby providing for example light of a first color temperature as directed light, and light with a second color temperature may be output from a lower portion (or the base) of the lighting device (or the luminaire in which the lighting device is arranged), thereby providing light of a second color temperature as surrounding light (the light being for example scattered by the luminaire).

According to some embodiments, the first angle may be in a range from 20° to 70°. The second angle may be in a range from 200 to 70°.

Arranging the LED filaments at such angles may provide a smooth transition between the color temperature of the light emitted near the top of the lighting device and the color temperature of the light emitted near the base of the lighting device. Such angles may further provide a balance between a more prominent difference in the CCT in light emitted in the different directions, which may be the effect of larger angles, and a more omni-directional lighting, which may be the effect of smaller angles.

For example, the first angle may be in a range from 25° to 65°. Specifically, the first angle may be in a range from 30° to 60°. More specifically, the first angle may be in a range from 350 to 55°.

For example, the second angle may be in a range from 25° to 65°. Specifically, the second angle may be in a range from 30° to 60°. More specifically, the second angle may be in a range from 350 to 55°.

According to some embodiments, the first angle may be at least substantially equal to the second angle.

Arranging the at least one first LED filament and the at least one second LED filament at a same (or at least substantially same) angle from the longitudinal axis may facilitate production of such lighting devices. It may further provide a pleasant appearance.

According to some embodiments, a difference between the first CCT and the second CCT may be at least 500 K.

A difference in CCTs of at least 500 K may provide a noticeable difference between the light provided in opposite directions (i.e. near the top of the lighting device and near the base of the lighting device).

For example, the difference between the first CCT and the second CCT may be at least 700 K. Specifically, the difference between the first CCT and the second CCT may be at least 900 K.

According to some embodiments, a difference between the first CCT and the second CCT may be lower than, or substantially equal to, 2000 K.

A difference in CCT which is lower than, or substantially equal to, 2000 K may provide a more homogeneous lighting and may allow a smoother transition between light having different CCTs.

For example, the difference between the first CCT and the second CCT may be lower than, or substantially equal to, 1700 K. Specifically, the difference between the first CCT and the second CCT may be lower than, or substantially equal to, 1600 K.

According to some embodiments, the first CCT may be higher than the second CCT.

Many luminaires and lighting devices are arranged such that a top of the lighting device, which is opposite to the base of the lighting device, points towards an area which is especially interesting to illuminate. Examples of such luminaires/lighting devices are desk lamps, task lights, reading lamps, many pendant lamps or the like. Such lighting devices may provide directed light towards the surface of interest, such as a table surface, and general light in other directions. Lighting devices according to the present embodiments, may provide a "cooler" directed light, i.e. with a higher CCT, towards a surface or area of interest, and a "warmer" surrounding light, with a lower CCT. A higher CCT may improve visibility of objects, and may for example facilitate reading, while a lower CCT may provide a more pleasant atmosphere.

According to some embodiments, the first CCT may be higher than, or substantially equal to, 2700 K.

For example, the first CCT may be higher than, or substantially equal to, 3000 K. Specifically, the first CCT may be higher than, or substantially equal to 3500 K, such as for example 4000 K.

According to some embodiments, the second CCT may be lower than, or substantially equal to, 2500 K.

For example, the second CCT may be lower than, or substantially equal to, 2300 K. Specifically, the second CCT may be lower than, or substantially equal to, 2200 K, such as for example 2000 K.

According to some embodiments, the lighting device may be adapted to emit light with an average CCT in a range from 2700 K to 3500 K.

The average CCT of a lighting device may be calculated by weighting the CCT of each LED filament by the flux of the LED filament, and averaging the weighted CCTs. Alternatively, the average CCT may be obtained by arranging the LED filaments in an integrating sphere and by measuring the resulting CCT from this arrangement.

For example, the average CCT may be in a range from 2800 K to 3300 K. Specifically, the average CCT of the lighting device may be in a range from 2900 K to 3100 K.

According to some embodiments, each of the at least one first LED filament and each of the at least one second LED filament may be arranged to emit at least X % of its light from its first side. X may be in a range from 60 to 90.

Thus, light emitted from the second side of such a LED filament may represent up to 1-X % (e.g. up to 10-40%) of the total light emitted by the LED filament.

For example, the percentage of light emitted from the first side (X) may be in a range from 65 to 85. Specifically, the percentage of light emitted from the first side (X) may be in a range from 70 to 80.

According to some embodiments, a number of the at least one first LED filament may be in a range from 2 to 6.

Further, a number of the at least one second LED filament may be in a range from 2 to 6.

In other words, according to some embodiments, the lighting device may comprise 2-6 first LED filaments. The lighting device may further comprise 2-6 second LED filaments.

For example, the number of first LED filaments may be in a range from 3 to 5, such as 4. For example, the number of second LED filaments may be in a range from 3 to 5, such as 4.

According to some embodiments, the lighting device may comprise at least two first LED filaments, and the number (N) of first LED filaments in the lighting device may be larger or equal than the number (M) of second LED filaments in the lighting device.

For example, there may be at least twice as many, and at most three times as many, first LED filaments as second LED filaments, i.e. $2M \leq N \leq 3M$. For example, there may be eight first LED filaments and three second LED filaments, i.e. N=8, M=3.

According to some embodiments, the lighting device may further comprise a controller. The controller may be configured to provide a first power supply to the at least one first LED filament and to provide a second power supply to the at least one second LED filament.

For example, the controller may be adapted to control the power supply to the at least one first LED filament separately, and/or differently, from the power supply to the at least one second LED filament.

For example, the controller may receive an input signal and provide power to the at least one first LED filament and power to the at least one second LED filament based on information provided by (or carried by) the input signal.

In embodiments comprising more than one first LED filament, the controller may be adapted to control power supplies to the first LED filaments individually or together as a group. Similarly, in embodiments comprising more than one second LED filament, the controller may be adapted to control power supplies to the second LED filaments individually or together as a group.

According to some embodiments, the controller may be configured to, as an input signal increases from a first input level to a second input level, increase the power supply to the at least one second LED filament from a first power level to a second power level, followed by an increase of the power supply to the at least one first LED filament from a first power level to a second power level. Alternatively, or additionally, the controller may be configured to, as an input signal decreases from the second input level to the first input level, decrease the power supply to the at least one first LED filament from a second power level to a first power level, followed by a decrease of the power supply to the at least one second LED filament from a second power level to a first power level.

Alternatively, as the input signal increases, the power supply to the first LED filaments may be increased first, followed by an increase of the power supply to the second LED filaments. In analogy, as the input signal decreases, the power supply to the second LED filaments may be decreased first, followed by a decrease of the power supply to the first LED filaments.

Thus, it will be appreciated that the controller may additionally, or alternatively, be configured in the opposite way, such that for example the power supply to the at least one first LED filament is increased first, followed by an increase of the power supply to the at least one second LED filament, as the input signal increases.

The first input level may be a minimum input level, and the second input level may be a maximum level.

The first power level of the at least one first LED filament may be equal to the first power level of the at least one second LED filament. However, the first power level of the at least one first LED filament may be different from the first power level of the at least one second LED filament. Similarly, the second power level of the at least one first LED filament may be equal to the second power level of the at least one second LED filament. The second power level of the at least one second LED filament may in other embodiments be different from the second power level of the at least one second LED filament.

According to some embodiments, the controller may further be configured to, simultaneously with an increase of the power supply to the at least one first LED filament from the first power level to the second power level, decrease the power supply to the at least one second LED filament. Alternatively, or additionally, the controller may be configured to, simultaneously with a decrease of the power supply to the at least one first LED filament from the second power level to the first power level, increase the power supply to the at least one second LED filament.

Thus, as the input signal increases, the at least one first LED filament lights up. When the second power level is reached, the intensity of the light may remain the same, but the CCT of the emitted light may change as the first LED filament(s) are dimmed and the light of at least one second LED filament is increased. This may for example continue until the first LED filament(s) is turned off and/or the second LED filament(s) is provided power at the second power level.

It is noted that other embodiments using all possible combinations of features recited in the above described embodiments may be envisaged. Thus, the present disclosure also relates to all possible combinations of features mentioned herein.

BRIEF DESCRIPTION OF DRAWINGS

Exemplifying embodiments will now be described in more detail, with reference to the following appended drawings.

As illustrated in the figures, the sizes of the elements and regions may be exaggerated for illustrative purposes and, thus, are provided to illustrate the general structures of the embodiments. Like reference numerals refer to like elements throughout.

DETAILED DESCRIPTION

Exemplifying embodiments will now be described more fully hereinafter with reference to the accompanying drawings in which currently preferred embodiments are shown. The invention may, however, be embodied in many different forms and should not be construed as limited to the embodiments set forth herein; rather, these embodiments are provided for thoroughness and completeness, and fully convey the scope of the invention to the skilled person.

Figure 1:
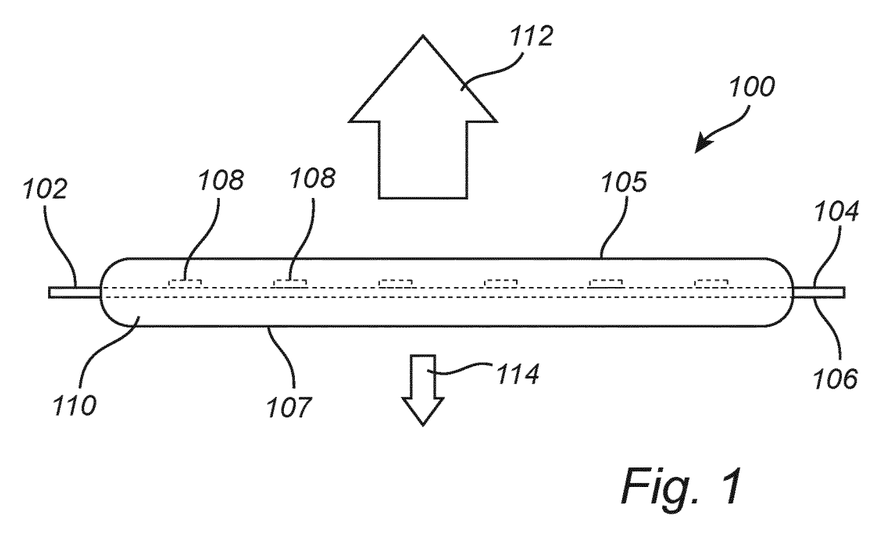
FIG. 1 shows a side view of a LED filament, in accordance with some embodiments.
Figure 1A:
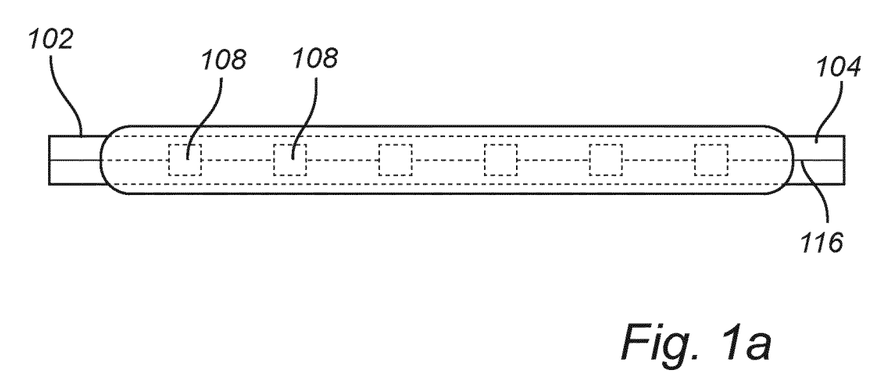
FIG. 1a shows a top view of a LED filament, in accordance with some embodiments.

With reference to FIGS. 1 and 1a, a LED filament in accordance with some embodiments will be described.

FIG. 1 shows a sideview of a LED filament 100, and FIG. 1a shows a top view of the same LED filament 100. The LED filament 100 comprises an elongated carrier 102. The carrier has a first (major) surface 104 and a second, opposite, (major) surface 106. A plurality of LEDs 108 is arranged in a linear array on the first surface 104 of the carrier 102. The LEDs 108 are connected by electrical connections 116, through which the LEDs 108 may be provided with power.

Typically, more than 10 LEDs 108 are provided on the LED filament. For example, more than 15 LEDs 108 may be provided, such as more than 20 LEDs 108.

An encapsulant 110 encapsulates the first surface 104 and the LEDs 108 of the LED filament 100. The encapsulant 110 may optionally, as in the embodiment depicted in FIGS. 1 and 1a, be provided on the second surface 106. The encapsulant 110 may for example be a polymer, such as silicone which provides good temperature stability.

The encapsulant 110 may comprise light-scattering particles dispersed in the encapsulant for scattering the light emitted by the LEDs 108. For example, light-scattering particles may include one or more of barium sulphate (BaSO4), titanium dioxide (TiO2) and aluminum oxide (Al2O3) particles.

Furthermore, one or more wavelength converting materials, such as luminescent materials, may be dispersed in the encapsulant. Such materials may absorb light at a first wavelength, and emit light at a second, different, wavelength. For example, a luminescent material may be a phosphor, such as a green/yellow phosphor (e.g. yttrium aluminum garnet (YAG) or lutetium aluminum garnet (LuAG)), and/or an orange/red phosphor (e.g. KSIF, ECAS).

The carrier 102 may be at least partially light-transmissive, such as transparent, such that some of the light emitted by the LEDs 108 may be transmitted through the carrier 102 and emitted from the second surface 116 of the carrier 102. The light transmitted through the carrier may form part of the smaller portion 114 of light which is emitted from the second side 107 of the LED filament 100. A larger portion 112 of the light is however emitted from the first side 105 of the LED filament. Thus, as illustrated by the arrows shown in FIG. 1, this means that, for a carrier 102 having LEDs arranged on its first major surface 104, a larger portion of light is emitted from the first surface 104 (and away from the carrier 102) than from the second surface 106, which may lead to a larger portion 112 of light being emitted from the first side 105 of the LED filament 100 than from the second side 107.

The LEDs 108 may comprise LEDs adapted to emit blue light and/or UV light. Alternatively, or additionally, the LEDs may comprise LEDs adapted to emit light of different colors, such as red, green and blue (RGB) LEDs. A combination of blue/UV LEDs and red LEDs may also be used.

Light emitted by the LEDs 108 (LED light) may thus be scattered by particles in the encapsulant. Some of the LED light may also be absorbed by a color converting material and emitted at a different wavelength. The color (and CCT) of the light emitted by the LED filament 100 may thus depend on which types (colors) of LEDs are used, and the presence (and type) of wavelength converting material in the encapsulant 110.

The LED filament 100 may emit light in all directions. A larger portion 112 of the light may however be emitted from the first side 105 of the LED filament 100. A smaller portion 114 of the LED light is then emitted from the second side 107 of the LED filament. The larger portion 112 of light and the smaller portion 114 of light have (substantially) the same color temperature.

In general, a LED filament may provide LED filament light and may comprise a plurality of light emitting diodes (LEDs) arranged in a linear array. Preferably, the LED filament has a length L and a width W, wherein L>5W. The LED filament may be arranged in a straight configuration or in a non-straight configuration such as for example a curved configuration, a 2D/3D spiral or a helix. Preferably, the LEDs are arranged on an elongated carrier, like for instance a substrate, that may be rigid (made from e.g. a polymer, glass, quartz, metal or sapphire) or flexible (e.g. made of a polymer or metal e.g. a film or foil).

In case the carrier comprises a first major surface and an opposite second major surface, the LEDs are arranged on at least one of these surfaces. The carrier may be reflective or light transmissive, such as translucent and preferably transparent.

The LED filament may comprise an encapsulant at least partly covering at least part of the plurality of LEDs. The encapsulant may also at least partly cover at least one of the first major or second major surface. The encapsulant may be a polymer material which may be flexible, such as for example a silicone. Further, the LEDs may be arranged for emitting LED light e.g. of different colors or spectrums. The encapsulant may comprise a luminescent material that is configured to at least partly convert LED light into converted light. The luminescent material may be a phosphor such as an inorganic phosphor and/or quantum dots or rods.

The LED filament may comprise multiple sub-filaments.

Figure 2:
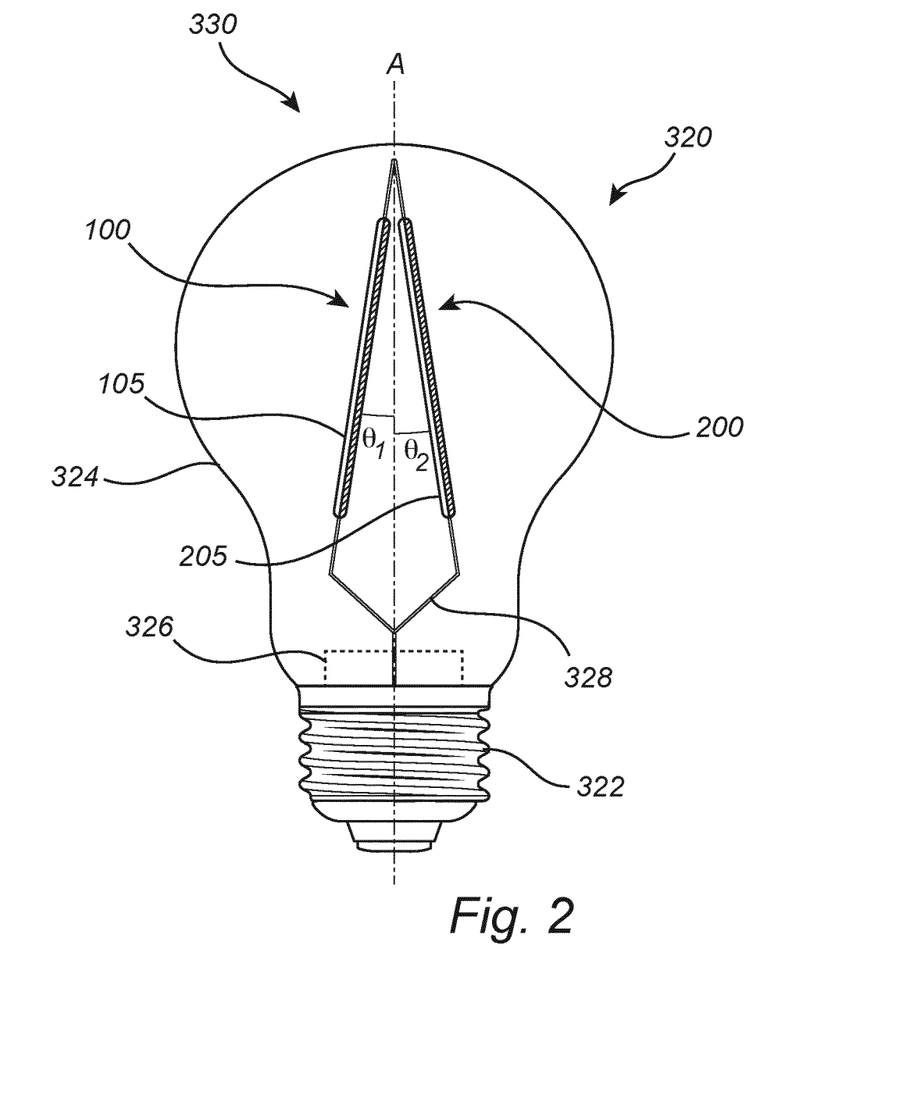
FIG. 2 illustrates a lighting device, in accordance with some embodiments.

With reference to FIG. 2, a lighting device in accordance with some embodiments will be described.

FIG. 2 is a schematic illustration of a lighting device 320 in accordance with some embodiments. The lighting device 320 comprises a first LED filament 100, and a second LED filament 200. Both the first and the second LED filaments 100, 200 may be equivalent to the LED filaments previously described with reference to FIGS. 1 and 1a. The first LED filament 100 is adapted to emit light with a first CCT, and the second LED filament 200 is adapted to emit light with a second CCT which is different from the first CCT.

The lighting device 320 further comprises an envelope 324, which is at least partially light-transmissive. The envelope 324 envelops the LED filaments 100, 200. The envelope 324 is mounted on a base 322, which is adapted to be connected with a socket of a luminaire.

The LED filaments 100, 200 are connected to the base by holding means 328, which also maintain the LED filaments 100, 200 in position within the envelope 324. Optionally, the lighting device may also comprise a controller 326, which may be adapted to provide a power supply to the first LED filament 100, and a power supply to the second LED filament 200. The holding means 328 may also comprise electrical connections connecting the LED filaments 100, 200 with the controller 326 and/or the base 322.

A longitudinal axis A extends from the base 322 to a top portion 330 of the lighting device 320. The top portion 330 is opposite to the base 322 along the longitudinal axis A. The first LED filament 100 is arranged at a first angle 61 from the longitudinal axis A. In this case, the angle θ1 is defined as the angle formed in a clockwise direction from the longitudinal axis A to the first LED filament 100. Further, the first LED filament 100 is arranged such that its first side 105 (and thus the first surface of its carrier) generally faces towards the top portion 330 of the lighting device 320, rather than facing towards the base 322.

The second LED filament 200 is arranged at a second angle θ2 from the longitudinal axis A. In this case, the angle θ2 is defined as the angle formed in a counter-clockwise direction from the longitudinal axis A to the first LED filament 200. Further, the second LED filament 200 is arranged such that its first side 205 (and thus the first surface of its carrier) generally faces towards the base 322, rather than facing towards the top portion 330 of the lighting device 320.

Figure 3:
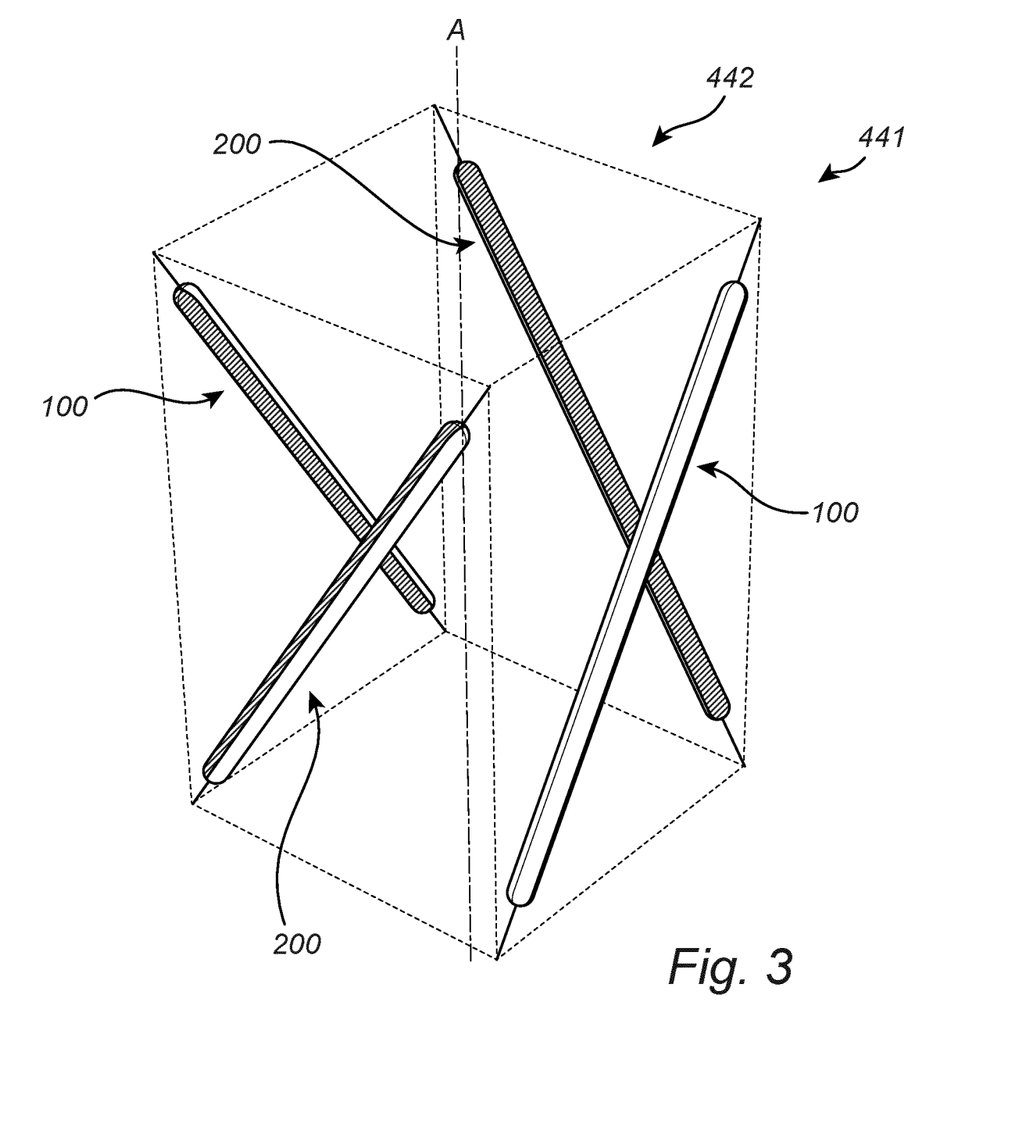
FIG. 3 illustrates a LED filament arrangement, in accordance with some embodiments.
Figure 4:
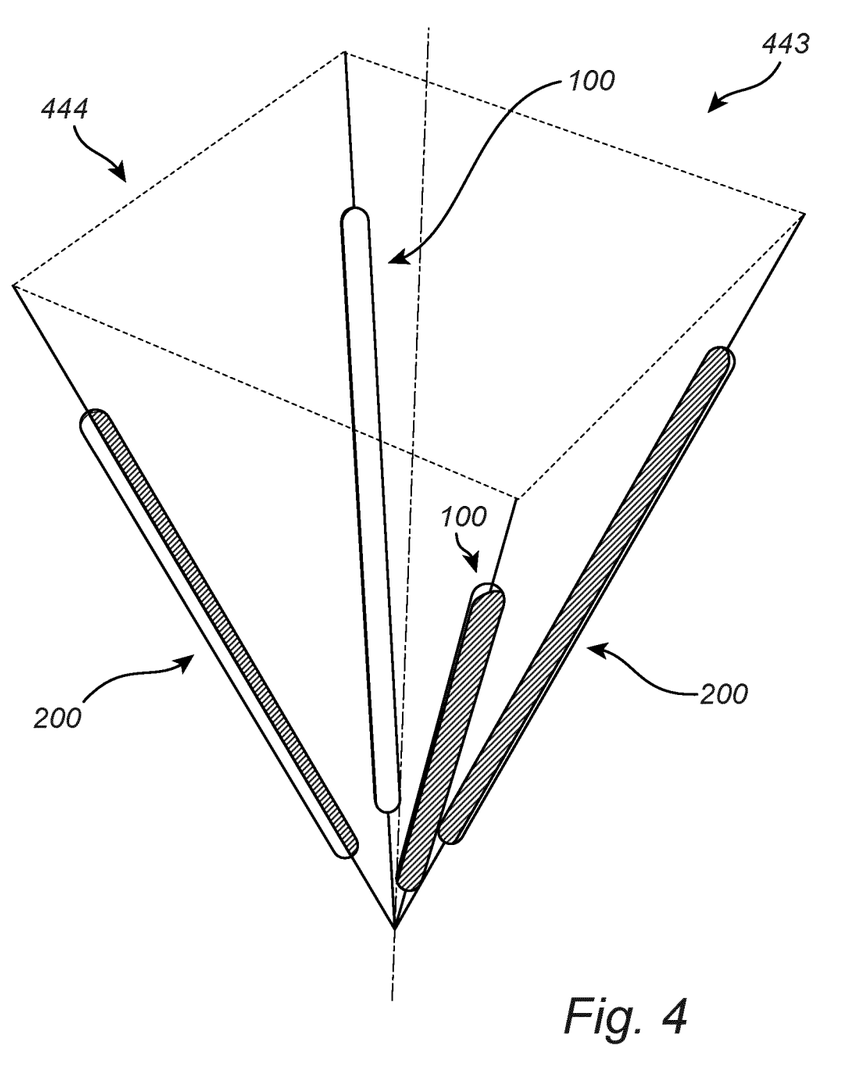
FIG. 4 illustrates a LED filament arrangement, in accordance with some embodiments.

With reference to FIGS. 3 and 4, different LED filament arrangements, in accordance with some embodiments, will be described.

FIG. 3 is a schematic illustration of a LED filament arrangement 441 in accordance with some embodiments. The LED filament arrangement 441 of FIG. 3 comprises two first LED filaments 100, which may be equivalent to the first LED filament 100 described above with reference to FIG. 2. The LED filament arrangement further comprises two second LED filaments 200, which may be equivalent to the second LED filament 200 described above with reference to FIG. 2.

All of the LED filaments 100, 200 are arranged at a substantially equal angle relative to the longitudinal axis A. The LED filaments 100, 200 are each arranged such that the whole length of the LED filament 100, 200 is arranged at a substantially same distance from the longitudinal axis A. The LED filaments are thus angled "to the side" relative to the longitudinal axis, and not towards/from the longitudinal axis A.

In the LED filament arrangement 441, the LED filaments 100, 200 are evenly spaced, and arranged such that their end points coincide with the corners of a rectangular cuboid 442. The first LED filaments 100 form diagonals of opposite sides of the cuboid. The second LED filaments 200 form diagonals of opposite sides of the cuboid. The LED filaments 100, 200 are all angled to the same side, such that none of the endpoints are arranged at the same corner of the rectangular cuboid.

It will be appreciated that other embodiments based on this configuration may be envisaged. In such configurations, the LED filaments are angled with respect to the longitudinal axis A, but the LED filaments extend along directions with do not intersect the longitudinal axis A. More generally, the LED filaments extends in planes representing the faces of a cuboid centered around the longitudinal axis A.

FIG. 4 shows a different example of a LED filament arrangement 443, also comprising two first LED filaments 100, and two second LED filaments 200, which may respectively be equivalent to the first LED filaments 100 and the second LED filaments 200, described above with reference to the preceding Figures.

In the LED filament arrangement 443, the LED filaments 100, 200 are evenly arranged around the longitudinal axis A. The two first LED filaments 100 are arranged opposite from one to another. The two second LED filaments 200 are arrange opposite from one to another. Furthermore, all the LED filaments are arranged at a same angle from the longitudinal axis A. The bottom ends of each of the LED filaments 100, 200 are arranged at a same distance from the longitudinal axis A, and the top ends of each of the LED filaments 100, 200 are arranged at a same, longer, distance from the longitudinal axis A. Thus, the LED filaments 100, 200 of the LED filament arrangement 443 coincide with the edges of an inverted (upside-down) pyramid 444.

It will be appreciated that FIGS. 3 and 4 are illustrative example describing different types of LED filament arrangements which may be arranged within lighting devices as described in this disclosure, such as the lighting device 320 described with reference to FIG. 2. Other LED filament arrangements may comprise more of fewer first LED filaments and/or second LED filaments. In some LED filament arrangements, the LED filaments may together describe other geometrical shapes, such as prisms or antiprisms, or be arranged in other ways which comply with the angles defined in this disclosure.

In a specific example, the LED filaments may be arranged forming a zig-zag or crown shape, wherein end points of two neighboring LED filaments are arranged in close proximity to one-another.

Figure 5:
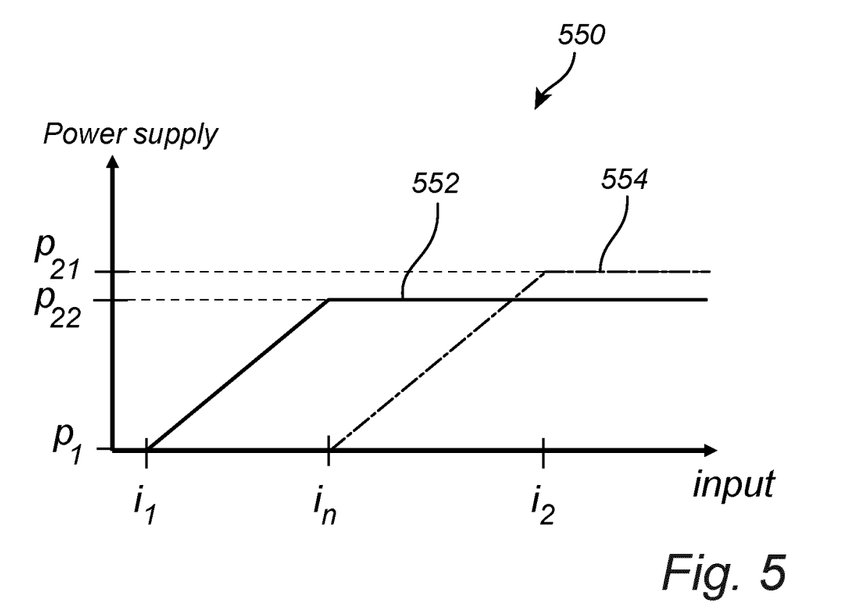
FIG. 5 illustrates a relationship between an input value to a controller and corresponding power supply levels, in accordance with some embodiments.
Figure 6:
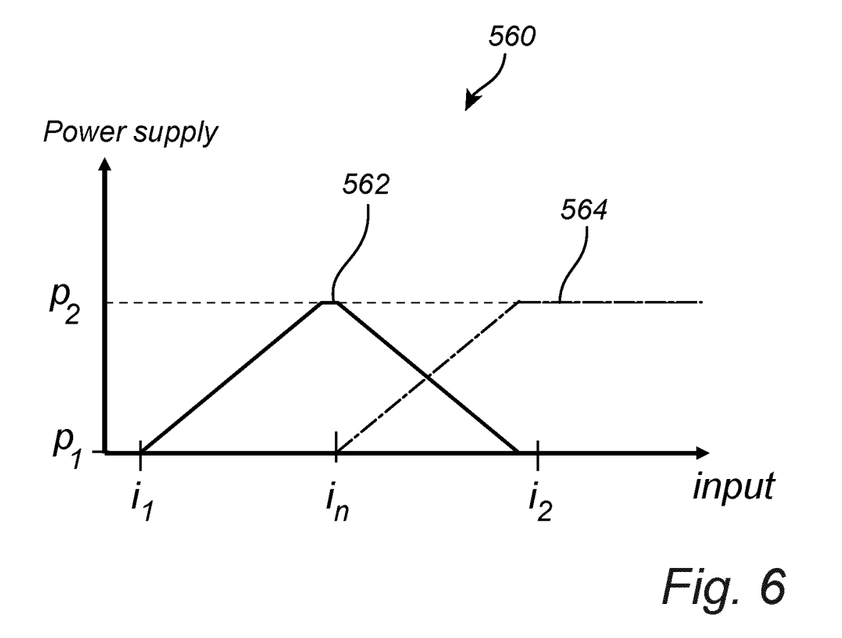
FIG. 6 illustrates a relationship between an input value to a controller and corresponding power supply levels, in accordance with some embodiments.

With reference to FIGS. 5 and 6, different methods for controlling power supply to the at least one first LED filament and the at least one second LED filament, in accordance with some embodiments, will be described. The methods may be implemented in a controller of a lighting device, such as the controller 326 described above with reference to FIG. 2.

FIG. 5 shows a relationship 550 between an input signal provided to a controller, and the corresponding power supply levels provided from the controller to the at least one first LED filament and the at least one second LED filament.

For very low levels of the input signal, no power supply is provided to any of the LED filaments. As the input signal increases (from left to right along the horizontal axis), past the first input signal level $i_1$, (or first threshold), the controller starts gradually increasing the power supply 552 to the second LED filament(s), from a first power supply level $p_1$ up to a second power supply level $p_{22}$. The power supply 552 to the second LED filament(s) does not increase above the second power supply level $p_{22}$, but rather stays at the same level as the input increases further, beyond the intermediate power level $i_n$ (or second threshold). Instead, as the input signal increases, the controller starts gradually increasing the power supply 554 to the at least one first LED filament. The power supply 554 to the first LED filament(s) increases from a first power level $p_1$, to a second power level $p_{21}$. In this embodiment, the first and second LED filaments share the same first power level $p_1$, but have different second power levels $p_{21}$, $p_{22}$. The first power level $p_1$ may in some implementations be equal to zero.

Thus, as the input level increases from the first input level $i_1$ to the intermediate input level $i_n$, a lighting device in which the controller is arranged emits light with the second CCT, with an increasing intensity. As the input level increases from the intermediate level $i_n$ to the second input level $i_2$, the intensity of the emitted light increases, and the CCT of the emitted light increases as well.

In the present embodiment, if the input increases above the second input level $i_2$, at which both the first and second LED filaments are at their second power levels, the controller does not further increase any of the power levels. In this embodiment, the relationship between the input level and the corresponding power supply levels does not depend on whether the input is increasing or decreasing, a specific level of the input signal provides the same power supply levels.

FIG. 6 shows another relationship 560 between an input signal to a controller and the corresponding power supply levels provided to the at least one first LED filament and the at least one second LED filament.

In FIG. 6, as the input signal increases from the first input signal level $i_1$, the power supply level 562 to the first LED filaments increases gradually from a first power level $p_1$ to a second power level $p_2$, like in the method described with reference to FIG. 5. If the input signal increases further, beyond the intermediate level $i_n$, the power supply level 562 to the first LED filaments decreases gradually towards the first power level $p_1$, while the power supply 564 to the second LED filaments simultaneously increases from the first power level $p_1$ to the second power level $p_2$.

Thus, as the input level increases from the first input level $i_1$ to the intermediate input level $i_n$, the lighting device emits light with the second CCT with an increasing intensity. As the input level increases from the intermediate level $i_n$ to the second input level $i_2$, the intensity of the emitted light may remain the same, while the CCT of the emitted light changes. At the second input level $i_2$, the lighting device emits light having the second CCT.

The person skilled in the art realizes that the present invention by no means is limited to the preferred embodiments described above. On the contrary, many modifications and variations are possible within the scope of the appended claims.

For example, by programming the input signal such that the power supply levels of the first and second LED filament(s) are adjusted in a way that the lighting device changes the direction of the emitted light.

For example, the arrangement of the LED filaments may vary, as long as the angles of the LED filaments comply with the provisions set out in the claims.

Although features and elements are described above in particular combinations, each feature or element can be used alone without the other features and elements or in various combinations with or without other features and elements.

Additionally, variations to the disclosed embodiments can be understood and effected by the skilled person in practicing the claimed invention, from a study of the drawings, the disclosure, and the appended claims. In the claims, the word "comprising" does not exclude other elements, and the indefinite article "a" or "an" does not exclude a plurality. The mere fact that certain features are recited in mutually different dependent claims does not indicate that a combination of these features cannot be used to advantage.

The invention claimed is:

1. A lighting device comprising:
   at least one first light-emitting diode, LED, filament adapted to emit light with a first correlated color temperature, CCT;
   at least one second LED filament adapted to emit light with a second CCT, different from said first CCT;
   wherein each of said first and second LED filament has a first side and a second side being arranged opposite to each other and extending along a direction of elongation of each of the first and second LED filament and wherein each LED filament is arranged to emit a first, larger, portion of light from its first side and a second, smaller, portion of light from its second side;
   a base connectable with a luminaire socket; and
   an at least partially light-transmissive envelope being mounted on said base and at least partially enveloping said at least one first LED filament and said at least one second LED filament;
   wherein a longitudinal axis (A) extends from said base to a top portion of said envelope;
   wherein each of said at least one first LED filament is arranged at a first angle ($\theta_1$) from said longitudinal axis, with its first side generally facing towards the top portion of the envelope; and
   wherein each of said at least one second LED filament is arranged at a second angle ($\theta_2$) from said longitudinal axis, with its first side generally facing towards the base.

2. The lighting device according to claim 1, wherein said first angle is in a range from 20° to 70°, and wherein said second angle is in a range from 20° to 70°.

3. The lighting device according to claim 1, wherein said first angle is at least equal to said second angle.

4. The lighting device according to claim 1, wherein a difference between said first CCT and said second CCT is at least 500 K.

5. The lighting device according to claim 1, wherein a difference between said first CCT and said second CCT is lower than, or equal to, 2000 K.

6. The lighting device according to claim 1, wherein said first CCT is higher than said second CCT.

7. The lighting device according to claim 1, wherein said first CCT is higher than, or equal to, 2700 K.

8. The lighting device according to claim 1, wherein said second CCT is lower than, or substantially equal to, 2500 K.

9. The lighting device according to claim 1, further adapted to emit light with an average CCT in a range from 2700 K to 3500 K.

10. The lighting device according to claim 1, wherein each of said at least one first LED filament and each of said at least one second LED filament is arranged to emit at least X % of its light from its first side, wherein X is in a range from 60 to 90.

11. The lighting device according to claim 1, wherein a number of said at least one first LED filament is in a range from 2 to 6; and wherein a number of said at least one second LED filament is in a range from 2 to 6.

12. The lighting device according to claim 1, comprising at least two first LED filaments, and wherein a number of said at least two first LED filaments is larger than a number of said at least one second LED filament.

13. The lighting device according to claim 1, further comprising a controller configured to provide a first power supply to said at least one first LED filament and a second power supply to said at least one second LED filament.

14. The lighting device of claim 13, wherein said controller is configured to, as an input signal increases from a first input level $i_1$ to a second input level $i_2$, increase the power supply to said at least one second LED filament from a first power level $p_1$ to a second power level $p_{22}$, followed by an increase of the power supply to said at least one first LED filament from the first power level $p_1$ to a second power level $p_{21}$; and/or
   as an input signal decreases from the second input level $i_2$ to the first input level $i_1$, decrease the power supply to said at least one first LED filament from the second power level $p_{21}$ to the first power level $p_1$, followed by a decrease of the power supply to said at least one second LED filament from the second power level $p_{22}$ to the first power level $p_1$.

15. The lighting device of claim 13, wherein said controller is further configured to, simultaneously with an increase of the power supply to at least one first LED filament from a first power level $p_1$ to a second power level $p_2$, decrease the power supply to the at least one second LED filament; and/or simultaneously with a decrease of the power supply to the at least one first LED filament from the second power level $p_2$ to the first power level, increase the power supply to the at least one second LED filament.

\* \* \* \* \*